(12) United States Patent
Hatsuda

(10) Patent No.: US 9,142,293 B2
(45) Date of Patent: Sep. 22, 2015

(54) RESISTANCE CHANGE TYPE MEMORY

(71) Applicant: KABUSHIKI KAISHA TOSHIBA, Minato-ku, Tokyo (JP)

(72) Inventor: Kosuke Hatsuda, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/198,410

(22) Filed: Mar. 5, 2014

(65) Prior Publication Data
US 2015/0070969 A1  Mar. 12, 2015

Related U.S. Application Data

(60) Provisional application No. 61/876,071, filed on Sep. 10, 2013.

(51) Int. Cl.
| | |
|---|---|
| *G11C 11/00* | (2006.01) |
| *G11C 13/00* | (2006.01) |
| *G11C 11/16* | (2006.01) |
| *G11C 11/15* | (2006.01) |
| *G11C 11/14* | (2006.01) |

(52) U.S. Cl.
CPC .............. *G11C 13/004* (2013.01); *G11C 11/14* (2013.01); *G11C 11/15* (2013.01); *G11C 11/1673* (2013.01)

(58) Field of Classification Search
CPC ........................................................ G11C 11/14
USPC .......................................................... 365/158
See application file for complete search history.

(56) References Cited

U.S. PATENT DOCUMENTS

| | | | | |
|---|---|---|---|---|
| 8,320,166 B2* | 11/2012 | Park et al. | ...................... | 365/158 |
| 2006/0092689 A1* | 5/2006 | Braun et al. | ................... | 365/158 |
| 2009/0067212 A1* | 3/2009 | Shimizu | ........................ | 365/148 |
| 2011/0157971 A1* | 6/2011 | Kim et al. | ...................... | 365/171 |
| 2013/0176773 A1* | 7/2013 | Yuh et al. | ...................... | 365/158 |
| 2013/0258762 A1* | 10/2013 | Chih et al. | ..................... | 365/158 |
| 2014/0153326 A1* | 6/2014 | Wang et al. | ................... | 365/163 |
| 2014/0269030 A1* | 9/2014 | Chih et al. | ..................... | 365/158 |

* cited by examiner

*Primary Examiner* — Son Mai
(74) *Attorney, Agent, or Firm* — Holtz, Holtz, Goodman & Chick PC

(57) ABSTRACT

According to one embodiment, a resistance change type memory includes a memory cell including a first resistance change element as a memory element; a reference cell including a second resistance change element and a first element having a resistance value which is not higher than a resistance range of the first and second resistance change elements; and a read circuit including a first input terminal connected to the memory cell, and a second input terminal connected to the reference cell.

15 Claims, 8 Drawing Sheets

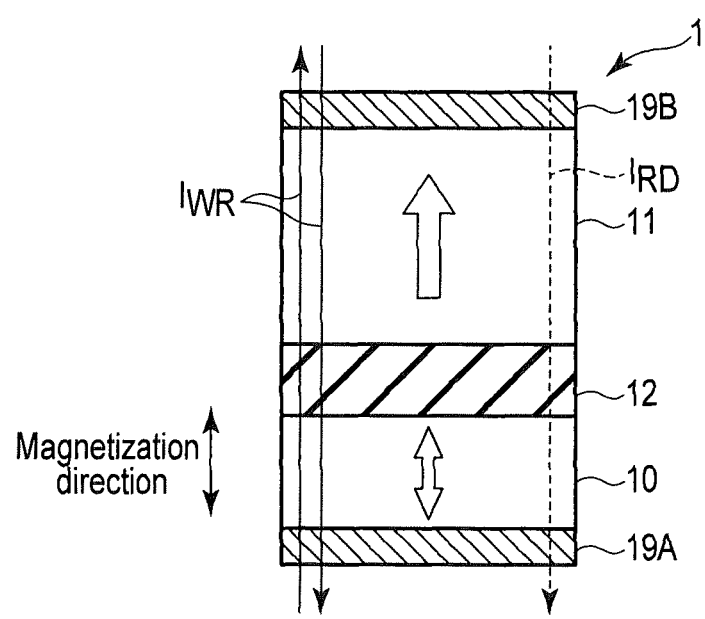
F I G. 2

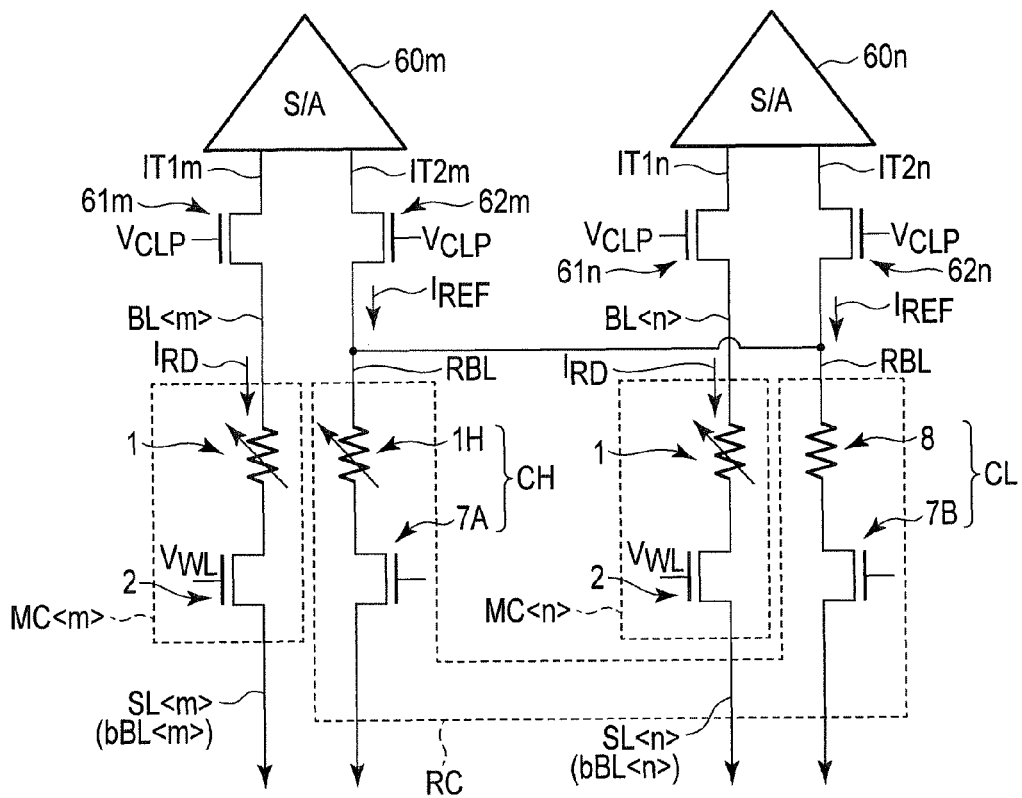
F I G. 3

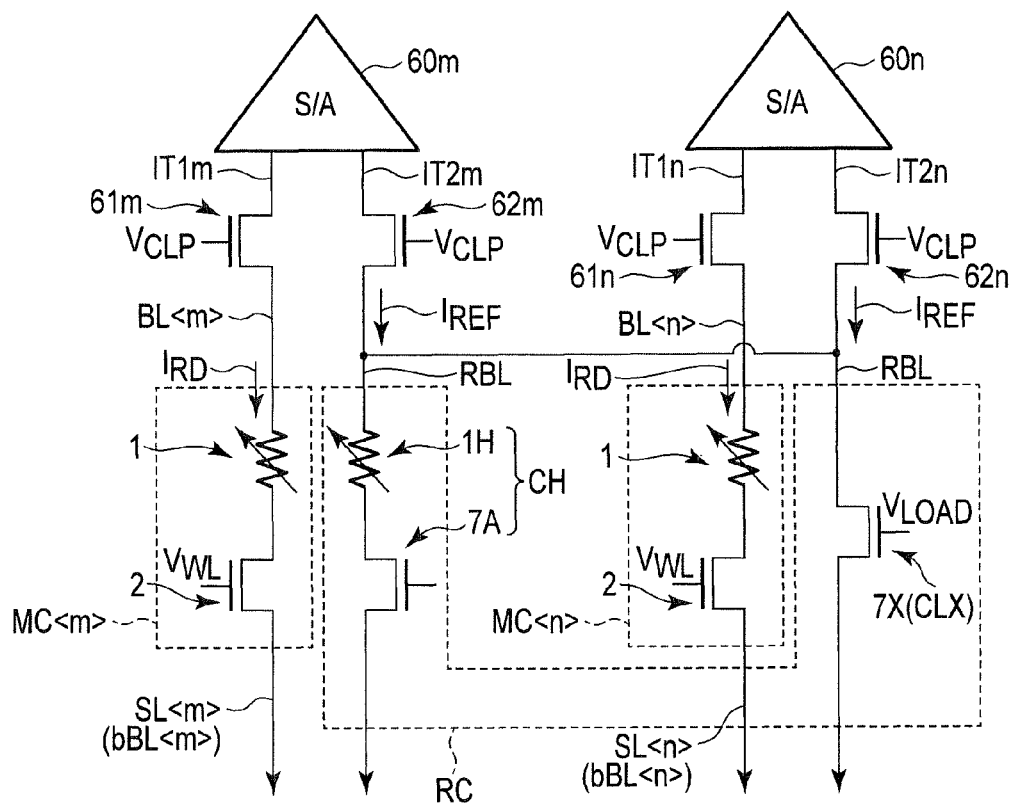
F I G. 7

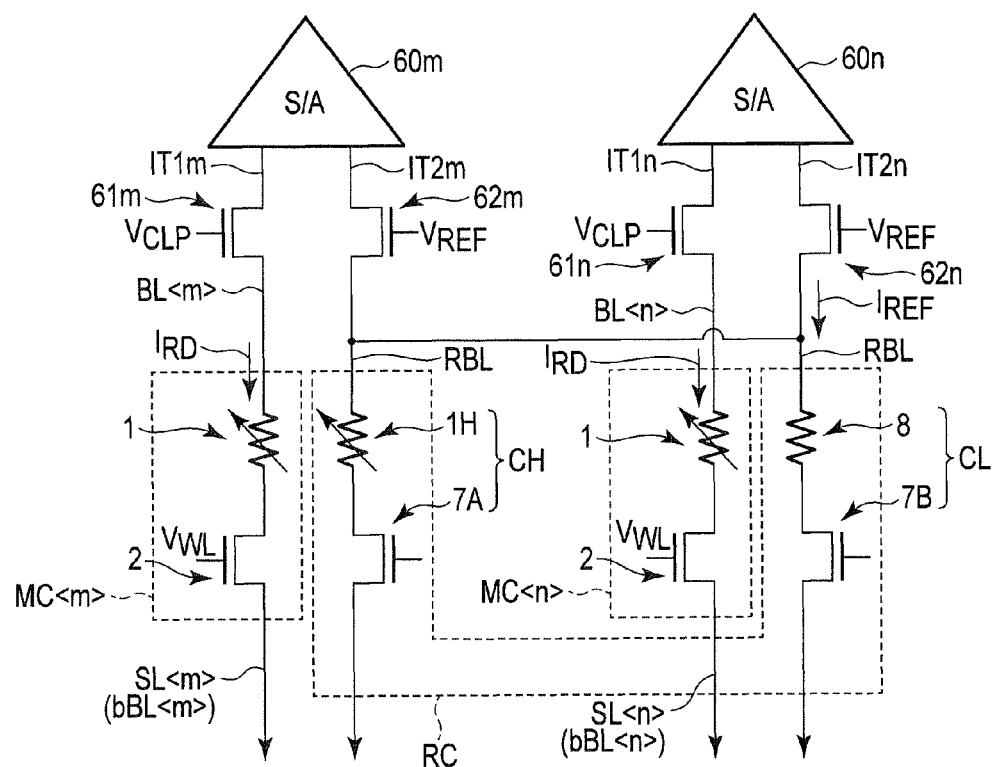
F I G. 8

RESISTANCE CHANGE TYPE MEMORY

CROSS-REFERENCE TO RELATED APPLICATIONS

This application claims the benefit of U.S. Provisional Application No. 61/876,071, filed Sep. 10, 2013, the entire contents of which are incorporated herein by reference.

FIELD

Embodiments described herein relate generally to a resistance change type memory.

BACKGROUND

Attention has been paid to resistance change type memories such as a magnetoresistive random access memory (MRAM), a resistive RAM (ReRAM) and a phase change RAM (PCRAM), as next-generation semiconductor memories. Since the resistance change type memories enable relatively easy microfabrication of elements, an increase in storage density and a decrease in power consumption can be realized.

As regards the resistance change type memories, there has been a demand for reliability in data write and data read.

BRIEF DESCRIPTION OF THE DRAWINGS

FIG. 2 is a view illustrating a structure example of a memory element of the resistance change type memory.

FIG. 3 is a view illustrating a structure example of a resistance change type memory according to a first embodiment.

FIG. 7 is a view illustrating a structure example of a resistance change type memory according to a third embodiment.

FIG. 8 is a view illustrating a structure example of a resistance change type memory according to a fourth embodiment.

DETAILED DESCRIPTION

Figure 1:
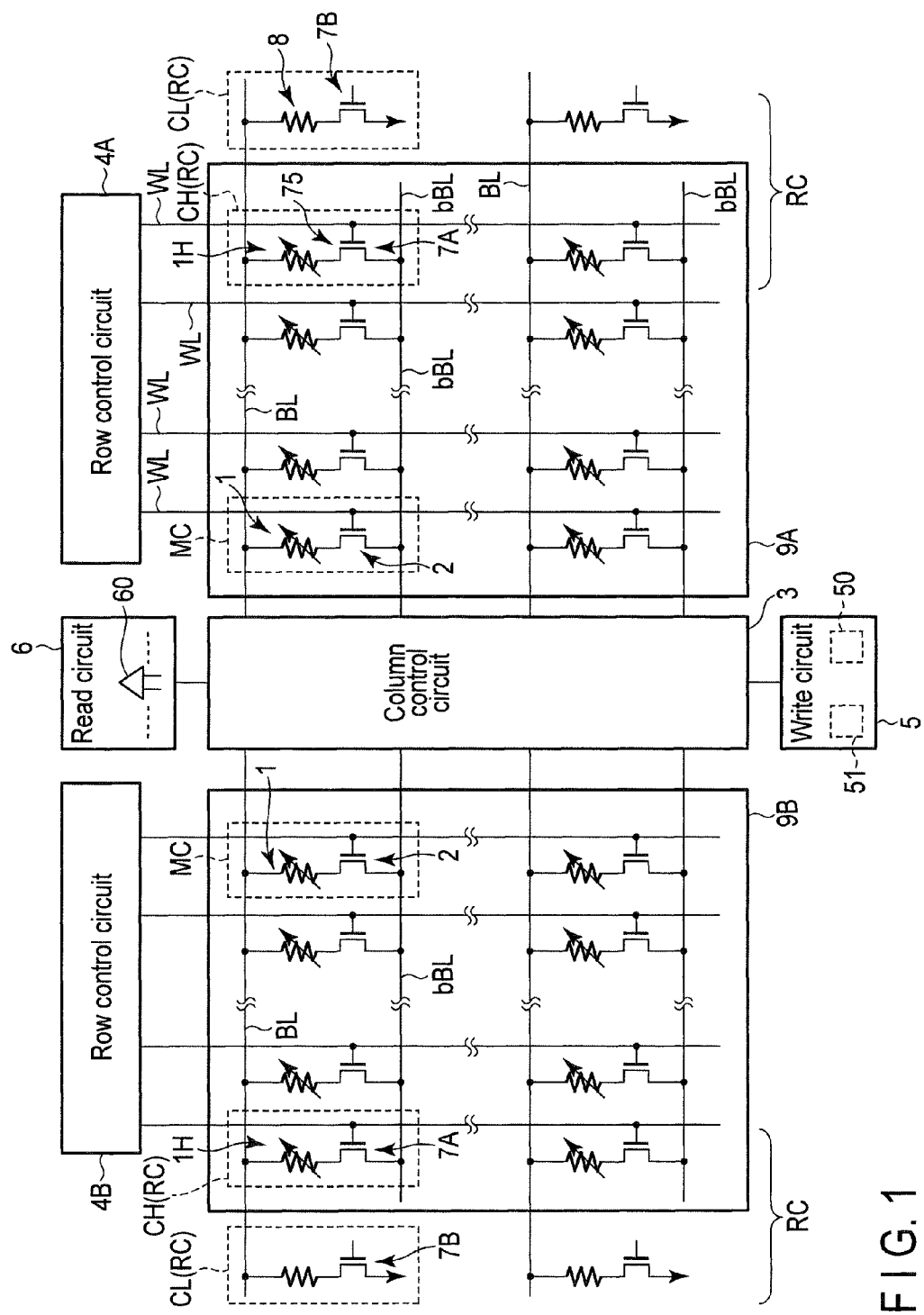
FIG. 1 is a view which schematically illustrates the whole structure of a resistance change type memory.

Various embodiments will be described hereinafter in detail with reference to the accompanying drawings. In the description below, elements having the same functions and structures are denoted by like reference numerals, and an overlapping description will be given where necessary.

In general, according to one embodiment, a resistance change type memory includes a memory cell including a first resistance change element as a memory element; a reference cell including a second resistance change element including the same material as the first resistance change element, and a first element, the first element having a resistance value which is not higher than a resistance range of the first and second resistance change elements; and a read circuit including a first input terminal connected to the memory cell, and a second input terminal connected to the reference cell.

(1) First Embodiment

Referring to FIG. 1 to FIG. 5, a resistance change type memory according to a first embodiment will be described.

(a) Structure

The structure of the resistance change type memory according to the first embodiment is described with reference to FIG. 1 to FIG. 5.

As illustrated in FIG. 1, the resistance change type memory of this embodiment includes one or more cell arrays 9A, 9B. For example, the resistance change type memory of this embodiment includes two cell arrays 9A, 9B. In the description below, when plural cell arrays 9A, 9B are not distinguished, the cell array is referred to as "cell array 9".

Each cell array 9 includes a plurality of memory cells MC. The plural memory cells MC are arranged in an array in the cell array 9. In the cell array 9, a plurality of bit lines BL, bBL and a plurality of word lines WL are provided. The bit lines BL, bBL extend in an X direction (column direction), and the word lines WL extend in a Y direction (row direction). Two bit lines BL, bBL constitute one bit line pair.

The memory cells MC are connected to the bit lines BL, bBL and word lines WL.

Plural memory cells MC, which are arranged in the X direction, are connected to a common bit line pair BL, bBL. Plural memory cells MC, which are arranged in the Y direction, are connected to a common word line WL.

The memory cell MC includes, for example, one resistance change element 1 as a memory element 1, and one select element 2. The resistance state of the resistance change element 1 is changed by being supplied with a current, voltage or energy (e.g., heat) of a certain threshold or more.

For example, when the resistance change memory is an MRAM, a magnetoresistive effect element is used for the resistance change element as the memory element.

FIG. 2 is a cross-sectional view illustrating a structure example of the magnetoresistive effect element.

The magnetoresistive effect element 1 as the memory element 1 includes a magnetic layer 10 having a variable magnetization direction, a magnetic layer 11 having a fixed-state (invariable) magnetization direction, and a nonmagnetic layer 12 between the two magnetic layers 10 and 11.

In the description below, the magnetic layer 10 with the variable magnetization direction is referred to as a memory layer (or a recording layer, a magnetization free layer) 10. The magnetic layer 11 with the invariable magnetization direction is referred to as a reference layer (or a pin layer, a pinned layer, a magnetization invariable layer) 11. In addition, the nonmagnetic layer 12 is referred to as a tunnel barrier layer 12.

The memory layer 10, tunnel barrier layer 12 and reference layer 11 form a magnetic tunnel junction. In the description below, the magnetoresistive effect element 1 including the magnetic tunnel junction is referred to as "MTJ element 1".

The two magnetic layers 10 and 11 have a magnetic anisotropy in a perpendicular direction to the film surface of the magnetic layers 10, 11, and the magnetization of the two magnetic layers 10 and 11 is directed in the perpendicular direction to the film surface. By the use of these magnetic layers with the magnetization in the perpendicular direction to the film surface for the MTJ element, the memory elements and memory cells of the resistance change type memory can be made finer in structure.

The magnetization direction of the memory layer 10 changes by an electric current of a predetermined magnitude flowing in the MTJ element 1. By the change of the magnetization direction of the memory layer 10, the relative magnetization orientation between the memory layer 10 and reference layer 11 varies, and the MTJ element 1 transitions into a high resistance state or a low resistance state.

When the magnetization direction of the memory layer 10 and the magnetization direction of the reference layer 11 of the MTJ element 1 are opposite to each other (antiparallel state), the MTJ element 1 is set in the high resistance state. When the magnetization direction of the memory layer 10 and the magnetization direction of the reference layer 11 of the MTJ element 1 are identical (parallel state), the MTJ element 1 is set in the low resistance state. The MTJ element 1 is used as the memory element by associating the resistance state of the MTJ element 1 and data that is to be stored.

The select element 2 is, for example, a field-effect transistor. In the description below, the field-effect transistor as select switch 2 is referred to as a cell transistor (or select transistor) 2.

One end of the resistance change element 1 is connected to a bit line BL, and the other end of the resistance change element 1 is connected to one end of a current path, or, source/drain, of the cell transistor 2. The other end of the current path, or, drain/source, of the cell transistor 2 is connected to a bit line bBL. A control terminal (gate) of the cell transistor 2 is connected to a word line WL.

In the case where the MRAM includes two cell arrays 9A and 9B, as in the present embodiment, row control circuits 4A, 4B are provided independently for respective cell arrays 9A, 9B.

One end of each of the word lines WL is connected to the row control circuit 4A or 4B. The row control circuits 4A, 4B control activation/deactivation of the word lines WL, based on an address signal from the outside.

The bit lines BL, bBL are connected to a column control circuit 3. The column control circuit 3 controls activation/deactivation of the bit lines BL, bBL, based on an address signal from the outside.

The column control circuit 3 is provided between two cell arrays 9A and 9B which are arranged in the X direction. The column control circuit 3 is made common to the two cell arrays 9A and 9B.

For example, when a hierarchical bit line scheme is applied to the MRAM, a plurality of global bit lines are provided in the cell arrays 9A, 9B. A predetermined number of bit lines are connected to each global bit line. A plurality of bit line pairs are connected to the column control circuit 3 via the global bit lines.

A write circuit 5 is connected to the bit lines BL, bBL via the column control circuit 3. The write circuit 5 includes a source circuit 50 such as a current source or a voltage source for generating a write pulse (write voltage or write current), and a sink circuit 51 for receiving the write pulse.

In the resistance change type memory, at a time of data write, the write circuit 5 supplies a write pulse to a memory cell which has been selected from the outside. By the supply of the write pulse, the resistance state (resistance value) of the resistance change element as the memory element changes.

For example, in the case where the resistance change type memory of the present embodiment is a spin torque transfer STT-MRAM, when data is written in the MTJ element 1, the write circuit 5 causes a write current as a write pulse to flow in the MTJ element 1 in the memory cell MC in one of two ways, in accordance with data that is to be written in the memory cell (write cell) of the data write target. Specifically, a write current flowing from the bit line BL to the bit line bBL or a write current flowing from the bit line bBL to the bit line BL is output from the write circuit 5 in accordance with data that is to be written in the MTJ element 1.

A change of the resistance state of the MTJ element 1 with use of the STT is executed by causing a current to flow in the MTJ element 1. As illustrated in FIG. 2, a write current $I_{WR}$ flowing from the memory layer 10 side to the reference layer 11 side or a write current $I_{WR}$ flowing from the reference layer 11 side to the memory layer 10 side is supplied to the MTJ element 1 in accordance with data to be written (the resistance state of the MTJ element, which is to be changed).

The magnetization reversal threshold of the reference layer 11 is set to be higher than the magnetization reversal threshold of the memory layer 10, so that the magnetization orientation of the reference layer 11 may not be changed when the current for changing the magnetization orientation of the memory layer 10 is supplied. An electric current with a value, which is not less than the magnetization reversal threshold of the memory layer 10 of the MTJ element 1 and is less than the magnetization reversal threshold of the reference layer 11, is supplied to the MTJ element 1 as the write current $I_{WR}$. Thereby, the relative magnetization orientation between the memory layer 10 and reference layer 11 is reversed. Thus, the resistance value of the MTJ element 1 changes, and predetermined data is written in the MTJ element 1 as the memory element.

At a time of data write, the magnetization orientation of the memory layer 10 of the MTJ element is varied by the STT method. Spin-polarized electrons included in the current $I_{WR}$, which flows in the element 1 and is not less than the magnetization reversal threshold of the memory layer 10, acts on the magnetization (spin) of the memory layer 10, and thereby the magnetization orientation of the memory layer 10 is varied.

That "the magnetization orientation of the reference layer 11 is invariable" or that "the magnetization orientation of the reference layer 11 is fixed" means that the magnetization orientation of the reference layer 11 does not vary when the write current (magnetization reversal current) $I_{WR}$, which is used for reversing the magnetization orientation of the memory layer 10, has flowed in the reference layer 11. Thus, in the MTJ element 1, a magnetic layer with a high magnetization reversal threshold is used as the reference layer 11, and a magnetic layer with a magnetization reversal threshold, which is lower than the magnetization reversal threshold of the reference layer 11, is used as the memory layer 10. Thereby, the MTJ element 1 including the memory layer 10 with the variable magnetization orientation and the reference layer 11 with the invariable magnetization orientation is formed.

When the magnetization orientation of the memory layer 10 and the magnetization orientation of the reference layer 11 are set in a parallel state by the STT method, that is, when the magnetization orientation of the memory layer 10 and the magnetization orientation of the reference layer 11 are set to be identical, a current $I_{WR}$, which flows from the memory layer 10 toward the reference layer 11, is supplied to the MTJ element 1. In this case, electrons move from the reference layer 11 toward the memory layer 10 via the tunnel barrier layer 12. Of the electrons which have passed through the reference layer 11 and tunnel barrier layer 12, majority electrons (spin-polarized electrons) have the same orientation as the orientation of magnetization (spin) of the reference layer 11. A spin angular momentum of the spin-polarized electrons is applied for the magnetization of the memory layer 10, and the magnetization orientation of the memory layer 10 is reversed to become identical to the magnetization orientation of the reference layer 11. When the magnetization orientation of the two magnetic layers 10 and 11 is a parallel orientation, the resistance value of the MTJ element 1 decreases to a minimum. For example, "0" data is assigned to the MTJ element 1 with the magnetization orientation which is a parallel orientation.

When the magnetization orientation of the memory layer 10 and the magnetization orientation of the reference layer 11 are set in an antiparallel state, that is, when the magnetization orientation of the memory layer 10 is set to be opposite to the magnetization orientation of the reference layer 11, a current $I_{WR}$, which flows from the reference layer 11 toward the memory layer 10, is supplied to the MTJ element 1. In this case, electrons move from the memory layer 10 toward the reference layer 11. Electrons with a spin, which is antiparallel to the magnetization orientation of the reference layer 11, are reflected by the reference layer 11. The reflected electrons are injected in the memory layer 10 as spin-polarized electrons. A spin angular momentum of the spin-polarized electrons (reflected electrons) is applied for the magnetization of the memory layer 10, and the magnetization orientation of the memory layer 10 is reversed to become opposite to the magnetization orientation of the reference layer 11. When the magnetization orientation of the two magnetic layers 10 and 11 is an antiparallel orientation, the resistance value of the MTJ element 1 increases to a maximum. For example, "1" data is assigned to the MTJ element 1 with the magnetization orientation which is an antiparallel orientation.

A read circuit 6 is connected to one end of each of the bit lines BL, bBL via the column control circuit 3. The read circuit 6 includes a voltage source or a current source for generating a read current, a sense amplifier 60 for sensing and amplifying a read signal, and a latch circuit for temporarily holding data.

At a time of data read from the MTJ element 1, the read circuit 6 supplies a read current to a memory cell (read cell) of a data read target. The current value of the read current is less than the current value (magnetization reversal threshold) of the write current, so that the magnetization of the memory layer may not be reversed by the read current.

In accordance with the magnitude of the resistance value of the MTJ element 1 to which the read current has been supplied, the current value or potential at a read node varies. Data stored in the MTJ element 1 is determined based on a variation amount (a read signal, a read output) corresponding to the magnitude of this resistance value.

The read circuit 6 includes one or more reference cells RC for generating a reference current which is a determination reference (read level) for data read with respect to the variation amount of current/potential due to the resistance value of the MTJ element.

The reference current which is the read level is generated by causing a current to flow to a composite resistor of a resistance value (hereinafter referred to as "intermediate resistance") having an intermediate magnitude between a resistance value R1 of an MTJ element in a high resistance state and a resistance value R0 of an MTJ element in a low resistance state.

As illustrated in FIG. 1, the reference cell RC includes two or more resistance elements 1H, 8, in order to form the intermediate resistance.

At least one of plural resistance elements included in the reference cell RC is formed by using, for example, the same material as the resistance change element (in this example, the MTJ element) as the memory element. For example, the MTJ element (also referred to as "reference MTJ element") as the resistance element in the reference cell RC is connected to the bit line pair to which the MTJ element as the memory element is connected.

The reference cell RC includes the resistance element 8 which is formed of a material (e.g., silicon) different from the material of the resistance change element, in addition to the MTJ element as the resistance element. The resistance element 8 is connected to, for example, the bit line BL. The resistance value of the resistance element (also referred to as "reference resistance element") 8 in the reference cell RC is different from the resistance value of the reference MTJ element 1H, and, for example, the resistance value of the resistance element 8 is less than the resistance value of the reference MTJ element 1H.

By the intermediate resistance formed from the plural resistance elements 1H, 8, a reference current is generated which has a current value between the current value of a read current $I_{RD}$ flowing in the MTJ element 1 in a "1" data storage state (high resistance state) and the current value of a read current $I_{RD}$ flowing in the MTJ element 1 in a "0" data storage state (low resistance state)

As described above, in the MRAM of the present embodiment, the reference cell RC includes the MTJ element (variable resistance element) 1H and the resistance element (fixed resistance element) 8. The resistance elements 1H, 8 in the reference cell RC are provided at an end of the cell array 9A on the side opposite to the column control circuit 3 side in the X direction.

At a time of data read, which of the plural reference MTJ elements and plural reference resistance elements are to be used for generating the reference current is determined by the control of the control circuit, based on a supplied address signal. For example, a reference MTJ element/reference resistance element, which is connected to a bit line that is different from the bit line of a memory cell of a data read target, is used for generating the reference current. In addition, as illustrated in FIG. 1, when the MRAM includes two cell arrays, the reference MTJ element/resistance element in one cell array, which is different from the other cell array in which the selected cell is provided, is used for generating the reference current. In the meantime, the reference MTJ element, which is connected to the same bit line pair as the selected cell, is not used at a time of data read of the selected cell.

The column control circuit 3, row control circuit 4, write circuit 5 and read circuit 6 are provided in the same chip as the cell array 9, and are provided in a peripheral region near the cell array 9. For example, a buffer circuit, a state machine (control circuit) or an Error Checking and Correcting (ECC) circuit may be provided in the same chip as the cell array 9.

FIG. 3 is a view for describing an example of the circuit structure of the MRAM as the resistance change type memory of the present embodiment at the time of data read.

The read circuit 6 of the MRAM includes, for example, current sensing-type sense amplifiers 60$m$, 60$n$.

At a time of data read, a data read target memory cell (referred to as "selected cell") is connected to one input terminal IT1$m$ of the sense amplifier 60$m$ via a bit line BL<m> which is set on a high potential side at a time of data read. The selected cell MC<m> is connected to a sink circuit (ground terminal) of the read circuit 6 via a bit line bBL<m> which is set on a low potential side at a time of data read. In the description below, the bit line bBL, which is set on a low potential side at a time of data read, is also referred to "source line SL".

A reference cell RC, which generates a determination level for determining data, is connected to the other input terminal IT2$m$ of the sense amplifier 60$m$ via an interconnect line (hereinafter referred to as "reference bit line") RBL. A reference current $I_{REF}$ for data determination of the selected cell MC<m> is generated by the reference cell RC.

Transistors (hereinafter referred to as "clamp transistors") 61m and 62m as control elements are provided, respectively at the first and second input terminals IT1m and IT2m of the sense amplifier 60m.

The bit line BL, which is connected to the selected cell MC<m>, is connected to the first input terminal IT1m of the sense amplifier 60m via a current path of the first clamp transistor 61m. The reference bit line RBL, to which the reference cell RC is connected, is connected to the second input terminal IT2m of the sense amplifier 60m via a current path of the second clamp transistor 62m.

In addition, a selected cell MC<n>, which is connected to a bit line pair BL<n>, bBL<n> (between a bit line BL<n> and a source line SL<n>), is connected to the sense amplifier 60n which is different from the sense amplifier to which the selected cell MC<m> is connected.

A first input terminal IT1n of the sense amplifier 60n is connected to the bit line BL<n> via a clamp transistor 61n. A second input terminal IT2n of the sense amplifier 60n is connected to the reference cell RC via a clamp transistor 62n. The input terminals IT2m and IT2n of the plural sense amplifiers 60m and 60n, which share the reference cell RC, are connected to each other.

The potential of each bit line BL, which is connected to the sense amplifier 60m or 60n, is controlled by a control voltage $V_{CLP}$ of the each clamp transistor 61m or 61n. The potential of each reference bit line RBL, which is connected to the sense amplifier 60m or 60n, is controlled by a control voltage $V_{CLP}$ of the each clamp transistor 62m or 62n.

In the description below, when the plural sense amplifiers 60m, 60n in the read circuit 6 are not distinguished, the sense amplifier is referred to as "sense amplifier 60". When the input terminals IT1m, IT1n on the selected cell side of the sense amplifier 60 are not distinguished, the input terminal is referred to as "input terminal IT1", and when the input terminals IT2m, IT2n on the reference cell side of the sense amplifier 60 are not distinguished, the input terminal is referred to as "input terminal IT2". In addition, when the clamp transistors 61m, 61n, 62m and 62n of the sense amplifier 60 are not distinguished, the clamp transistor is referred to as "clamp transistor 61, 62".

The control voltages (hereinafter referred to as "clamp voltages") $V_{CLP}$ are supplied to the gates of the clamp transistors 61, 62, and the potentials of the bit lines BL, RBL, to which the memory cell (selected cell) and reference cell are connected, are controlled. For example, a clamp voltage $V_{CLP1}$ of the input terminal IT1 on the selected cell MC<m> side is equal to a clamp voltage $V_{CLP2}$ of the input terminal IT2 on the reference cell <RC> side. The potentials of the bit lines BL, RBL are controlled at about 0.2 V to 0.4V by the clamp transistors 61, 62.

Substantially equal clamp voltages $V_{CLP}$ are supplied, as voltages for controlling the potentials of the bit lines BL, RBL, to the gates of the clamp transistors 61, 62 of the input terminals IT1, IT2 to which the selected cells MC<m>, MC<n> and reference cell RC are connected.

In this manner, the potentials of the input terminals IT1, IT2 of the sense amplifiers 60 and the bit lines BL, RBL are controlled by clamp voltages $V_{CLP}$ of the same magnitude, and thereby the magnitudes of noise occurring at the input terminals IT1, IT2 and bit lines BL, RBL can be made substantially equal between the plural input terminals IT1, IT2 and between the plural bit lines BL, RBL. Therefore, in the MRAM of the present embodiment, the influence of noise occurring at the time of data read can be decreased.

In the structure example of the read circuit 6 illustrated in FIG. 3, at the time of data read, one reference cell RC is commonly connected to the two sense amplifiers 60m and 60n. Thereby, data read from plural selected cells is parallel-processed. In the plural selected cells MC<m> and MC<n> which are connected to different select bit line pairs, the data of the selected cell MC<m> connected between the bit line pair BL<m>, bBL<m> and the data of the selected cell MC<n> connected between the bit line pair BL<n>, bBL<n> are read out substantially simultaneously by the sense amplifier 60m and sense amplifier 60n, respectively.

The current $I_{RD}$ flowing in the selected cell MC is compared with the reference current $I_{REF}$, and thereby it is determined whether the data in the selected cell MC is "1" data or "0" data. By such comparison of current values by the sense amplifier 60, the data is read out from the selected cell.

In the MRAM of the present embodiment, the reference cell RC, which is made common to the two sense amplifiers 60m and 60n, includes, for example, at least two resistance elements (one MTJ element and one fixed resistance element) 1H, 8, in order to form an intermediate resistance (e.g., 1/(1/R0+1/R1)) of the memory element 1.

The two resistance elements 1H, 8 in the reference cell RC are connected in parallel between the input terminals IT2 on the reference cell side of the sense amplifier 60 and a ground terminal GND in the sink circuit.

For example, the resistance element 1H, which is one of the two resistance elements, is connected to the ground terminal GND via a transistor 7A as a control element (select element) for selecting the resistance element 1H and the source line (reference source line). In addition, the resistance element 8, which is the other of the two resistance elements, is connected to the ground terminal GND via a transistor 7B as a control element (select element) for selecting the resistance element 8.

The reference cell RC having an intermediate resistance between a resistance value of a high resistance state of the MTJ element as the memory element and a resistance value of a low resistance state thereof is formed by the two resistance elements 1H and 8.

A resistance value Rr1 of the resistance element 1H, which is one of the two resistance elements 1H and 8, is set to be substantially equal to the resistance value R1 of the high resistance state of the MTJ element 1. A resistance value Rr0 of the resistance element 8, which is one of the two resistance elements 1H and 8, is set to be substantially equal to the resistance value R0 of the low resistance state of the MTJ element 1.

In the present embodiment, of the plural resistance elements 1H, 8 for forming the intermediate resistance of the MTJ element (resistance change element) 1 as the memory element in the reference cell RC, the resistance element 1H, which has the resistance value Rr1 that is substantially equal to the resistance value R1 of the high resistance state of the MTJ element 1, is formed of the same structure (the element of the same kind, same material and same size) as the MTJ element 1. In addition, of the resistance elements 1H, 8 which form the reference cell RC, the resistance element 8, which has the resistance value Rr0 that is substantially equal to the resistance value R0 of the low resistance state of the MTJ element 1, is formed of a material different from the material of the MTJ element 1. The resistance element (fixed resistance element) 8 on the low resistance side with the resistance value Rr0 (=R0) in the reference cell RC is, for instance, a polysilicon resistance element or a diffusion layer resistance element.

In the meantime, if the reference cell RC includes the MTJ element 1H in the high resistance state and the fixed resistance element 8 with the resistance value Rr0, the intermediate resistance of the reference cell RC may be formed by using plural MTJ elements 1H and plural fixed resistance elements 8. In addition, if the resistance value between the high resistance state and low resistance state of the MTJ element 1 can be formed, the resistance value of the fixed resistance element 8 may not be equal to the resistance value of the low resistance state of the MTJ element 1.

In the description below, for the purpose of clearer description, the resistance element (reference MTJ element) 1H with the resistance value Rr1, which is substantially equal to the resistance value R1 of the high resistance state of the resistance change element, may also be referred to as "high resistance element (reference high resistance element) 1H", and the resistance element (reference resistance element) 8 with the resistance value Rr0, which is substantially equal to the resistance value R0 of the low resistance state of the resistance change element, may also be referred to as "low resistance element (reference low resistance element)". In addition, a structure CH including the high resistance element 1H and transistor 7A is referred to as a "1" cell (high resistance cell) CH, and a structure CL including the low resistance element 8 and transistor 7B is referred to as a "0" cell (low resistance cell) CL.

In the meantime, as illustrated in FIG. 3, in the "1" cell CH and "0" cell CL of the reference cell RC, at the time of data read, by the control of the column control circuit 3, the "1" cell and "0" cell, which are connected to mutually different bit line pairs of the bit line pairs other than the bit line pair to which the data read target memory cell is connected, may be connected to the input terminals IT2 on the reference cell side of the sense amplifier 60. The "1" cell CH and "0" cell CL, which are connected to the same bit line pair, may be connected to the sense amplifier 60.

For example, at the time of data read, which "1" cell and "0" cell of plural "1" cells and "0" cells are to be selected in order to constitute the reference cell RC is controlled by the control circuit (not shown) in the MRAM chip and the column control circuit 3, based on an address signal from the outside. Based on the control of the column control circuit 3, one or more "1" cells (high resistance cells) and one or more "0" cells (low resistance cells) are connected by the interconnects and switch elements in the column control circuit 3, and the reference cell RC for generating the reference current $I_{REF}$ is formed.

In the meantime, the number of "1" cells and "0" cells which form one reference cell RC may be properly adjusted in accordance with the structure of the sense amplifiers 60 (sense amplifiers 60 which share the reference cell RC) which are operated in parallel. Specifically, in one reference cell RC, two or more "1" cells CH (reference MTJ elements 1H) may be provided, or two or more "0" cells CL (resistance elements 8) may be provided.

At the time of data read of the MRAM, the direction of flow of the reference current $I_{REF}$ in the reference cell RC is set to be identical to the direction of "1" data write in the MTJ element. The reference current $I_{REF}$ flows in a direction from the reference layer side toward the memory layer of the MTJ element in the reference cell RC. Thereby, the MTJ element 1H in the reference cell RC is kept in the high resistance state ("1" data retention state), without causing magnetization reversal of the MTJ element by the reference current $I_{REF}$. For example, the direction in which the read current $I_{RD}$ flows in the MTJ element in the selected cell is, like the direction in which the reference current $I_{REF}$ flows in the reference MTJ element 1H, is set to be identical to be the direction of the write current for "1" data write.

Figure 4:
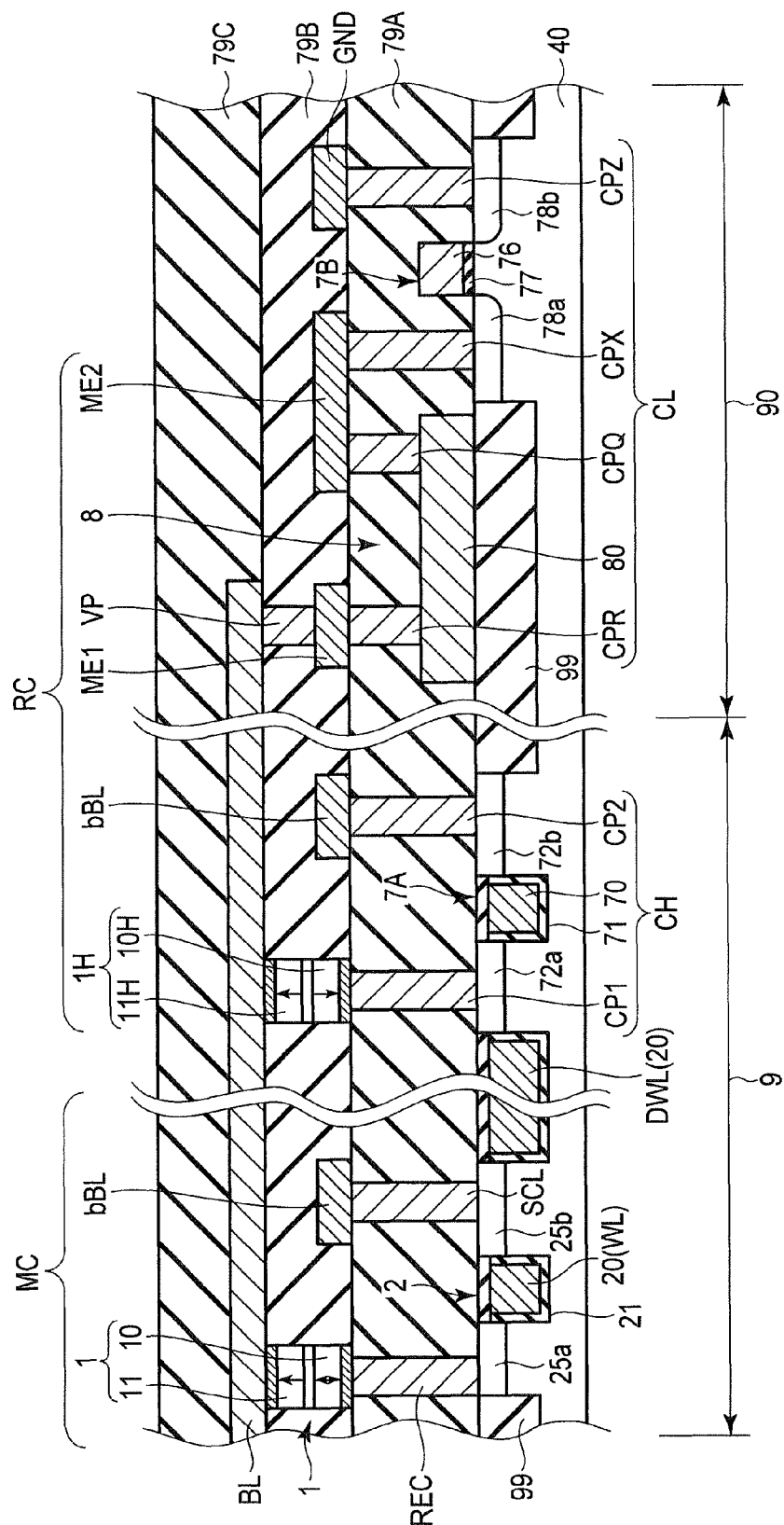
FIG. 4 is a cross-sectional view illustrating a structure example of the resistance change type memory of the first embodiment.

FIG. 4 is a cross-sectional view which schematically illustrates a structure example of the memory cell and reference cell of the MRAM of the present embodiment.

As has been described above, the memory cell MC includes one resistance change element (memory element) 1 and one field-effect transistor (cell transistor) 2.

The cell transistor 2 is a field-effect transistor with a buried gate structure. The cell transistor 2 with the buried gate structure includes a gate electrode (buried gate electrode) 20 in a recess formed in a semiconductor substrate 40, a gate insulation film 21 between the semiconductor substrate (channel region) 40 and the gate electrode 20, and a source/drains 25a, 25b provided in the semiconductor substrate (active region) 40. The gate electrode 20 of the cell transistor 2 extends in the Y direction, and serves as a common gate of a plurality of cell transistors 2 which are arranged in the Y direction. The gate electrode 20 functions as a word line.

The surface of the semiconductor substrate 40 is covered with interlayer insulation films 79A, 79B and 79C.

The MTJ element 1 is provided in the interlayer insulation film 79B. One end of the MTJ element 1 is connected to a bit line BL on the interlayer insulation film 79B. The other end of the MTJ element 1 is connected to the source/drain (source/drain diffusion layer) 25a of the cell transistor 2 via a contact plug REC which is buried in the interlayer insulation film 79A. The source/drain 25b of the cell transistor 2 is connected to a bit line bBL in the interlayer insulation film 79B via a contact plug SCL in the interlayer insulation film 79A.

Memory cells MC, which are arranged in the X direction (column direction), are electrically isolated by, for example, a dummy structure DWL. The dummy structure DWL has, for example, the same structure as the buried gate electrode 20 of the cell transistor 2. The potential of the dummy structure DWL is controlled, whereby the neighboring memory cells are electrically isolated. However, the neighboring memory cells may be isolated by an insulation film which is buried in the semiconductor substrate 40.

As illustrated in FIG. 1 to FIG. 4, the high resistance-side cell ("1" cell) CH of the reference cell RC is provided in the cell array 9, and is connected to the same bit lines BL, bBL as the memory cell MC.

The "1" cell CH includes an MTJ element as a resistance element (also referred to as a "1" resistance element) 1H, and a field-effect transistor 7A.

The MTJ element 1H of the "1" cell CH is an element which is formed at the same time as the MTJ element 1 as the memory element. The MTJ element 1H is provided in the interlayer insulation film 79B.

The field-effect transistor 7A of the "1" cell CH has the same structure as the cell transistor 2. The transistor 7A in the "1" cell CH has a buried gate structure, and includes a gate electrode 70 buried in the semiconductor substrate 40, a gate insulation film 71 between the gate electrode 70 and the semiconductor substrate 40, and a source/drains 72a, 72b provided in the semiconductor substrate 40.

For example, the gate electrode (reference word line) 70 of the transistor 7A extends in the row direction, and is shared by a plurality of "1" cells which are arranged in the row direction. The potential of the gate electrode 70 is controlled by the row control circuit 4.

One end of the MTJ element 1H is connected to the bit line BL. The other end of the MTJ element 1H is connected to the source/drain 72a of the transistor 7A via a contact plug CP1. The source/drain 72b of the transistor 7A is connected to a bit line bBL via a contact plug CP2. The source/drain 72b of the transistor 7A may be connected to a ground line, without being connected to the bit line bBL.

The MTJ element (reference MTJ element, high-resistance element) 1H in the reference cell RC has a resistance value Rr1 which is equal to the resistance value R1 of the high resistance state of the MTJ element 1 as the memory element. The MTJ element 1H as the resistance element 1H is not used for storing data from the outside, and the resistance state of the MTJ element 1H is kept to be the high resistance state ("1" data retention state). The magnetization orientation of a reference layer 11H and a memory layer 10H of the MTJ element 1H is fixed in an antiparallel state.

For example, as described above, when the MTJ element in the cell array 9 is formed such that an electric current in a direction of "1" data write flows in the MTJ element 1H in the reference RC at a time of data read, the MTJ elements 1, 1H are formed such that the reference layers 11, 11H of the MTJ elements 1, 1H are disposed on the bit line BL side which is set at a high potential at a time of data read. In the example shown in FIG. 4, each of the MTJ elements 1, 1H has a top pin structure in which the reference layers 11, 11H are stacked on the memory layers 10, 10H with the tunnel barrier layers interposed.

The low resistance side cell ("0" cell) CL of the reference cell RC is provided in a region 90, i.e., a peripheral region, for example, on the outside of the cell array 9.

The "0" cell (low resistance side cell) CL includes a resistance element 8 and a transistor 7B.

The resistance element 8 in the "0" cell CL, also referred to as a "0" resistance element 8, is formed of, for example, a polysilicon layer (or a polycide layer) 80. The polysilicon layer 80 as the resistance element 8 is provided, for example, on an insulation film 99 in the semiconductor substrate 40.

The transistor 7B in the "0" cell CL is, for example, a field-effect transistor with a planar structure. The transistor 7B includes a gate insulation film 77 on the surface of the semiconductor substrate 40, a gate electrode 76 on the gate insulation film 77, and source/drains 78a, 78b in the semiconductor substrate 40.

For example, one end of the polysilicon layer 80 as the resistance element 8 is connected to the bit line BL via a contact plug CPR on the polysilicon layer 80 and a plug VP and an intermediate interconnect ME1 in the interlayer insulation films 79A and 79B.

The other end of the polysilicon layer 80 as the resistance element is connected to the source/drain 78a of the transistor 7B via a plurality of plugs CPQ, CPX and an intermediate interconnect ME2. The source/drain 78b of the transistor 7B is connected to the ground line GND via a contact plug CPZ. In the meantime, in FIG. 1 and FIG. 4, the "0" cell CL is connected to the ground line GND which is isolated from the source line bBL. However, the "0" cell CL may be connected to the source line (bit line) bBL which is common to the memory cell MC and "1" cell. In addition, when the hierarchical bit line scheme is applied to the MRAM, the resistance element 8 of the "0" cell may be connected to the global bit line.

The polysilicon layer 80 as the resistance element 8 is formed at the same time as, for example, the resistance element used in the peripheral circuit and the gate electrode 76 of the transistor 7B.

By adjusting the dimension (line width, length, or film thickness) of the polysilicon layer 80 as the resistance element 8 by using a well-known semiconductor manufacturing process, the resistance value of the resistance element 8 in the reference cell RC can be controlled. With the resistance value of the resistance element 8 being controlled, the magnitude of the reference current $I_{REF}$ can be adjusted. Incidentally, the resistance value of the resistance element 8 may be controlled by adjusting the impurity concentration in the polysilicon layer 80.

The resistance value of the resistance element 8 (the size of the resistance element 8) is adjusted so that the composite resistance of the plural resistance elements 1H, 8 in the reference cell RC may be set at an intermediate value between the resistance value R1 of the high resistance state of the MTJ element 1 and the resistance value R0 of the low resistance state of the MTJ element 1 (e.g., 1/(1/R0+1/R1)).

The resistance element 8 having substantially the same resistance value Rr0 as the resistance value R0 of the low resistance state of the MTJ element 1 may be formed by using a diffusion layer (semiconductor region) provided in the semiconductor substrate 40. The resistance value of the resistance element (diffusion layer resistor) 8 using the diffusion layer is set at a predetermined resistance value (in this example, the resistance value R0 of the low resistance state of the MTJ element) by the adjustment of the concentration of impurities doped in the semiconductor substrate 40 by ion implantation.

In this manner, in the case where the resistance element 8 of the "0" cell included in the reference cell RC is provided in the region 90 outside the memory cell array 9, the variance of the resistance value or the magnitude of the resistance value of the resistance element 8 in the reference cell RC can be controlled, without restrictions of the structure/material of the memory element used in the memory cell MC. Thereby, the reference cell RC of the MRAM of the present embodiment can relatively easily generate a reference current with a current value in a desired range.

In the meantime, the resistance value Rr0 of the resistance element 8 may become, in some cases, smaller than the resistance value R0 of the low resistance state of the MTJ element 1, or may become, in some cases, greater than the resistance value R0 of the low resistance state of the MTJ element 1, in accordance with the variance in processes or the circuit configuration of the sense amplifier which uses the reference cell.

Figure 5:
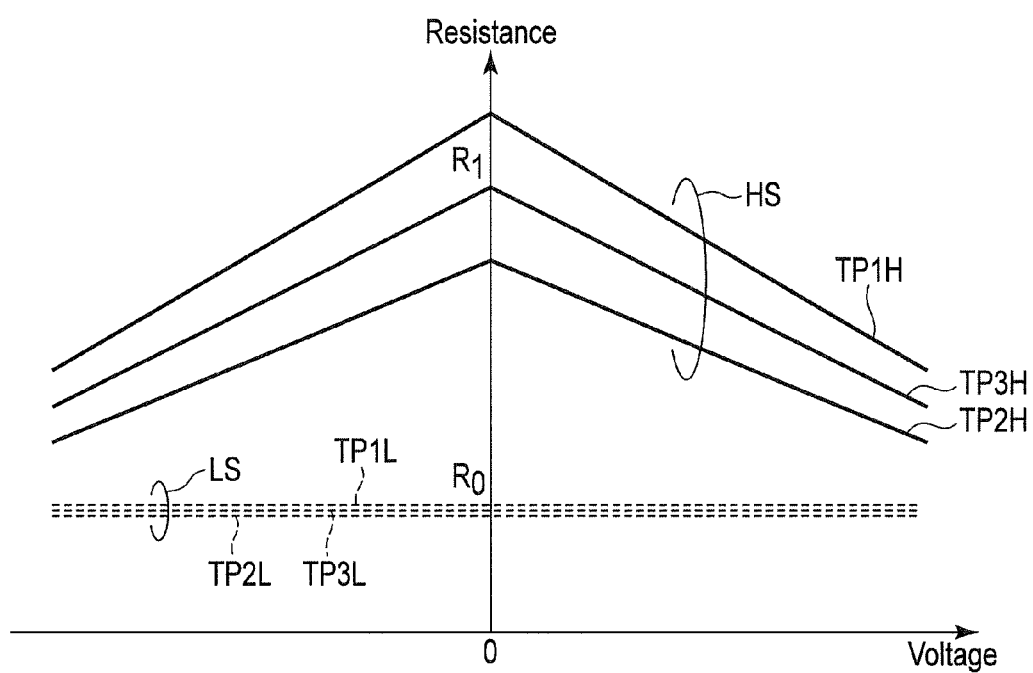
FIG. 5 is a view illustrating characteristics of a memory element of the resistance change type memory.

Referring to FIG. 5, the characteristics of the memory element of the resistance change type memory of the present embodiment are explained. FIG. 5 is a view illustrating characteristics of the resistance change memory as the memory element.

The abscissa of FIG. 5 indicates the magnitude of the voltage between terminals of the resistance change element, and the ordinate of FIG. 5 indicates the magnitude of the resistance value of the resistance change element. The range of the inter-terminal voltage, which is used for the measurement in FIG. 5, is set to be a range smaller than the voltage for generating a write pulse to the resistance change element.

FIG. 5 shows the relationship between the application voltage and resistance value in the resistance change element in the high resistance state and the resistance change element in the low resistance stage. In addition, FIG. 5 shows measurement results of the resistance change elements measured under mutually different temperature conditions. Characteristic lines (measurement results) TP1H and TP1L indicate measurement results of the resistance change elements under lower temperature conditions than characteristic lines TP2H and TP2L. Characteristic lines TP3H and TP3L indicate measurement results of the resistance change elements under temperature conditions between the characteristic lines TP1H, TP1L and characteristic lines TP2H, TP2L.

In FIG. 5, the resistance change elements, whose characteristics were measured, are MTJ elements.

As indicated by the measurement results TP1L, TP2L and TP3L of the MTJ element LS in the low resistance state in FIG. 5, the magnitude of the resistance value of the MTJ element in the low resistance state hardly varies even if the magnitude of the application voltage varies. The resistance value of the MTJ element LS in the low resistance state is substantially constant, without depending on the magnitude of the inter-terminal voltage.

In addition, as indicated by the measurement results TP1L, TP2L and TP3L of the MTJ element LS in FIG. 5, as regards the MTJ element LS in the low resistance state, the variation of the resistance value of the MTJ element LS in relation to the variation in temperature is small.

As indicated by the measurement results TP1H, TP2H and TP3H of the MTJ element HS in the high resistance state in FIG. 5, there is a tendency that the resistance value of the MTJ element HS in the high resistance state becomes lower as the inter-terminal voltage of the MTJ element HS becomes higher.

Besides, as indicated by the measurement results shown in FIG. 5, if the temperature in the measurement environment (operation environment) varies, the resistance value of the MTJ element HS in the high resistance state greatly varies, compared to the resistance value of the MTJ element LS in the low resistance state. As shown in FIG. 5, at a certain inter-terminal voltage, the resistance value of the MTJ element HS in the high resistance state under the high temperature condition becomes lower than the resistance value of the MTJ element HS in the high resistance state under the low temperature condition.

As indicated by the characteristics TP1H, TP1L, TP2H, TP2L, TP3H and TP3L shown in FIG. 5, the temperature dependency of the resistance value of the MTJ element in the high resistance state is greater than the temperature dependency of the resistance value of the MTJ element in the low resistance state.

As illustrated in FIG. 5, the MTJ element HS in the high resistance state (antiparallel state) has a temperature dependency and a voltage dependency with respect to the resistance value thereof. There is a tendency that the MTJ element LS in the low resistance state (parallel state) has a much lower temperature dependency and voltage dependency of the resistance value than the MTJ element HS in the high resistance state.

Therefore, the MTJ element exhibits such a tendency that the MR ratio of the MTJ element (the resistance ratio between the resistance value of the MTJ element in the high resistance state and the resistance value of the MTJ element in the low resistance state) becomes smaller if the temperature rises or if the inter-terminal voltage of the MTJ element increases.

In the read circuit 6 of the resistance change type memory (e.g., MRAM) of the present embodiment, the reference cell RC for generating the reference current $I_{REF}$ which is a determination reference of data read, a read level, includes the resistance change element (MTJ element) 1H in the high resistance state and the fixed resistance element 8 with the resistance value Rr0 which is substantially equal to or smaller than the resistance value R0 of the resistance change element 1 in the low resistance state. For example, the resistance value of the resistance element (fixed resistance element) 8 in the reference cell RC is not higher than a lower limit of the variation range of the resistance value of the resistance change element 1, 1H.

The intermediate resistance between the resistance value R1 of the high resistance state of the resistance change element 1 as the memory element and the resistance value R0 of the low resistance state thereof (i.e., R1/2+R0/2) is formed by the resistance change element (MTJ element) 1 and resistance element 8 in the reference cell RC.

In a general MRAM, in a reference cell in which an intermediate resistance value of a memory element is formed by an MTJ element in a high resistance state and an MTJ element in a low resistance state, when an electric current in such a direction as to transition the resistance change element into the high resistance state is supplied to plural MTJ elements in the reference cell, it is possible, with a certain probability, that the MTJ element in the low resistance state transitions into the high resistance state, even if this electric current is small. Conversely, when an electric current in such a direction as to transition the MTJ element into the low resistance state has been supplied to plural MTJ elements in the reference cell, it is possible that the MTJ element in the high resistance state transitions into the low resistance state.

Thus, when the intermediate resistance value of the memory element is formed by two MTJ elements with different resistance states, it is possible that a reference current of a desired current value cannot be generated due to a change in resistance state of the MTJ element in the reference cell, which is caused by the reference current, and data read of the memory becomes defective.

In the present embodiment, only one of the two or more resistance elements, which form the intermediate resistance of the memory element in the reference cell RC, is the MTJ element (resistance change element).

At the time of data read, the reference current $I_{REF}$ is generated by the reference cell RC so that a current flowing in the same direction as a write current, which is supplied when "1" data is written, may flow in the MTJ element 1H in the reference cell RC. The direction, in which the reference current $I_{REF}$ (part of the reference current $I_{REF}$) flows in the MTJ element 1H in the reference cell RC, is set to be the direction of a flow from the reference layer side to the memory layer side of the MTJ element 1H.

Thereby, in the MTJ element 1H in the high resistance state ("1" data retention state) in the reference cell RC, there occurs no unintentional magnetic reversal of the memory layer due to the reference current $I_{REF}$. Therefore, the MTJ element 1H in the high resistance state (the MTJ element with reference value Rr1) in the reference cell RC does not transition from the high resistance state to the low resistance state by the reference current $I_{REF}$ at the time of data read.

The resistance element 8 with the resistance value Rr0, which is substantially equal to the resistance value R0 of the low resistance state of the MTJ element 1 of the reference cell RC, is formed of a silicon resistance element (or a diffusion layer resistance element). Thus, even if a current is supplied to the resistance element 8 with the resistance value Rr0, no variation occurs in the resistance value of the resistance element 8 due to the current flowing in the resistance element 8, unlike in the MTJ element (resistance change element).

Therefore, in the MRAM of the present embodiment, since no variation occurs in the reference current due to the variation of the resistance values of the resistance elements 1H, 8 in the reference cell RC, a data read defect can be suppressed.

As has been described with reference to FIG. 5, when the memory element is the MTJ element, the MTJ element in the low resistance state has a much lower voltage dependency and temperature dependency than the MTJ element in the high resistance state.

In the MRAM of the present embodiment, the matching of the intermediate resistance (reference current) of the reference cell with the voltage dependency and temperature dependency of the resistance value of the MTJ element as the memory element, or the follow-up characteristic of the reference current to the voltage/temperature, can be secured, because the MTJ element 1H in the high resistance state is used for the resistance element for forming the intermediate resistance of the memory element, even if the element other than the MTJ element is used for the reference cell RC.

In the MRAM of the present embodiment, since there is little need to consider the temperature dependency and voltage dependency of the element with respect to the resistance element 8 with the resistance value R0 (Rr0) which is substantially equal or lower than in the low resistance state of the MTJ element in the reference cell RC, the resistance element with the resistance value Rr0 can be formed of a material different from the material of the MTJ element.

Since the resistance element (fixed resistance element) 8 in the reference cell RC can be formed with an element size which is relatively larger than the element size of the MTJ element 1, the variance in resistance value Rr0 of the resistance element 8 can be decreased.

As has been described above, in the MRAM of the present embodiment, in order to form the intermediate resistance of the MTJ element (memory element), the MTJ element 1H in the high resistance state and the resistance element 8 with the resistance value Rr0, which is substantially equal to the resistance value of the MTJ element in the low resistance state, are used in the reference cell RC for generating the reference current $I_{REF}$.

Thereby, the MRAM of the present embodiment can decrease the variance in reference current for data read in the chip of the MRAM, while ensuring the operation (the generation of reference current) of the reference cell with respect to the temperature dependency and voltage dependency according to the operation environment and specifications of the MRAM.

Therefore, according to the resistance change type memory of the first embodiment, the reliability of the memory can be improved.

(b) Operation Example

An operation example of the resistance change type memory of the first embodiment will be described.

Referring to also FIG. 1 to FIG. 5 where necessary, the operation of the resistance change type memory of the present embodiment is described.

When data read has been requested from the outside, the read circuit 6 is rendered active.

The sense amplifier 60 in the read circuit 6 corresponding to a memory cell (selected cell) of a data read target, is turned on, and a clamp voltage $V_{CLP}$ is supplied to the gate (reference word line) of the clamp transistor 61, 62. The input terminal IT1 of the sense amplifier 60 is connected to the bit line BL on the high potential side of the bit line pair (selected bit line pair) to which the selected cell is connected, via the clamp transistor 61 which is in the ON state, and the input terminal IT2 on the reference cell side of the sense amplifier 60 is connected to the bit line (reference bit line) RBL to which the reference cell RC that is driven is connected, via the clamp transistor 62 which is in the ON state. Thereby, the high potential-side bit lines BL, RBL are boosted up to a predetermined potential (e.g., about 0.3 V). For example, in the MRAM of FIG. 1, the reference cell RC is selected from one cell array which is different from the other cell array in which the selected cell MC is provided.

In addition, the sink circuit in the read circuit 6 is turned on, and is connected to the low potential-side source lines SL (bit lines bBL) of the selected bit line pair, respectively.

In this manner, the bit lines BL, bBL are activated at a timing earlier than the word line WL, and the bit lines BL, bBL are charged in the state in which the bit line BL and source line SL are isolated by the cell transistor 2 which is in the OFF state.

After the bit line BL is activated, the word line WL is activated, and a word line voltage $V_{WL}$ is applied to the word line WL (the gate of the cell transistor 2). In addition, after the reference bit line RBL is activated, the ON voltages of the transistors 7A, 7B are applied to the gates of the transistors 7A, 7B in the reference cell RC.

At a timing when the cell transistor 2 is turned on, a read current $I_{RD}$ flows in the selected cell MC including the MTJ element in the "1" data or "0" data retention state, by the potential difference between the bit line and source line. At a timing when the transistors 7A, 7B in the reference cell RC are turned on, a current $I_{REF}$ flows in the reference cell RC by the potential difference between the reference bit line and source line/ground terminal.

In the present embodiment, the reference cell RC includes the MTJ element (reference MTJ element) 1H in the high resistance state and the fixed resistance element 8 with the resistance value Rr0 which is substantially equal to (or smaller than) the resistance value R0 of the low resistance state of the MTJ element 1.

The intermediate resistance value between the resistance value R1 of the MTJ element 1 in the high resistance state and the resistance value R0 of the MTJ element 1 in the low resistance state is formed by the composite resistance between the MTJ element 1H with the resistance value Rr1 (=R1) and the resistance element 8 with the resistance value Rr0 (=R0). The reference current $I_{REF}$ is generated by the current flowing in the reference MTJ element 1H with the resistance value Rr1 and the resistance element 8 with the resistance value Rr0, which form the intermediate resistance of the memory element.

The magnitude of the read current $I_{RD}$ varies in accordance with the resistance state of the MTJ element in the selected cell.

After the read current $I_{RD}$ flowing between the bit line and source line and the reference current $I_{REF}$ generated by the reference cell RC are sampled by the sense amplifier 60, the word line and bit line are set in an inactive state at a predetermined timing.

By the sense amplifier 60, the magnitude of the read current (cell current) $I_{RD}$, which flows in the selected cell MC, is compared with the magnitude of the reference current $I_{REF}$ generated by the reference cell RC.

When the MTJ element 1 in the selected cell MC is in the low resistance state, the read current $I_{RD}$ flowing in the selected cell MC becomes higher than the reference current $I_{REF}$. In this case, it is determined by the sense amplifier 60 that the data stored in the selected cell MC is "0" data.

When the MTJ element 1 in the selected cell MC is in the high resistance state, the read current $I_{RD}$ flowing in the selected cell MC becomes lower than the reference current $I_{REF}$. In this case, it is determined by the sense amplifier 60 that the data stored in the selected cell MC is "1" data.

By the comparison between the read current $I_{RD}$ and the reference current $I_{REF}$ by the sense amplifier 60, the data stored in the selected cell MC is read out.

In the case where parallel processing of data read is executed, the above-described operation is executed substantially simultaneously by plural sense amplifiers 60m, 60n which share the reference cell RC.

In the above manner, the data read of the resistance change type memory of the present embodiment is executed.

In the meantime, at the time of data write in the MRAM of the present embodiment, the read circuit 6 is electrically isolated from the bit lines, and the high resistance cell CH and low resistance cell CL in the reference cell RC are rendered inactive.

At the time of data write, the write circuit 5 in FIG. 1 is connected to the bit lines BL, bBL. In accordance with data that is to be written in a memory cell of a data write target, the source circuit 50 of the write circuit 5 is connected to one bit line of a bit line pair (selected bit line pair) to which the memory cell MC of the data write target is connected, and the sink circuit 51 of the write circuit 5 is connected to the other bit line of the bit line pair.

The potential of the word line (selected word line), to which the memory cell of the write target is connected, is controlled, and the cell transistor 2 in the memory cell is turned on. A write current generated by the write circuit 5 is supplied from the bit line to the memory cell. An electric current flowing in a direction corresponding to data to be written, that is, a current flowing from the memory layer side to the reference layer side of the MTJ element, or a current flowing from the reference layer side to the memory layer side, is supplied to the MTJ element 1 of the write target.

Thereby, the data to be written is written in the memory cell of the data write target.

As has been described above, in the data read of the MRAM of the present embodiment, the reference current $I_{REF}$ which is a determination reference (read level) of data stored in the memory cell, is generated by the reference cell RC which includes the MTJ element (resistance change element) in the high resistance state and the fixed resistance element with the resistance value R0 of the low resistance state of the MTJ element.

As regards the temperature dependency and voltage dependency of the MTJ element as the memory element, the temperature dependency and voltage dependency of the resistance value of the MTJ element in the high resistance state are greater than the temperature dependency and voltage dependency of the resistance value of the MTJ element in the low resistance state. The resistance value of the MTJ element in the low resistance state hardly varies, even if a variation occurs in the temperature and the inter-terminal voltage.

In the data read of the MRAM of the present embodiment, even if the temperature and application voltage of the MRAM have varied in accordance with the operation environment and specifications of the MRAM, the matching of the reference current with the temperature dependency and voltage dependency of the resistance value of the MTJ element is secured since the MTJ element 1H in the high resistance state, which is formed of the same material as the memory element, is used for the resistance element of the reference cell RC.

In the MRAM of the present embodiment, since the temperature dependency and voltage dependency of the characteristics of the MTJ element in the low resistance state are very small, the element with the resistance value, which is substantially equal to (or lower than) the resistance value of the low resistance state of the memory element, can be formed of the resistance element which is formed of a material different from the material of the memory element. Therefore, compared to the MTJ element, the variance of the resistance value of the resistance element, which is used for the reference cell RC, can be decreased.

As a result, as regards the current $I_{REF}$ which is used for data read of the resistance change type memory of the present embodiment, the variance in current value in the resistance change type element is suppressed.

In the present embodiment, of the two resistance elements 1H, 8 for forming the intermediate resistance value of the MTJ element, the element formed of the MTJ element is the element 1H which is set at the same resistance value as the resistance value R1 of the high resistance state of the MTJ element.

Therefore, in the data read of the MRAM of the present embodiment, the direction of the flow of the current $I_{REF}$ which is supplied to the MTJ element 1 in the reference cell RC, is set to be the direction in which the resistance state of the MTJ element 1H transitions into the high resistance state, and thereby a change of the resistance state of the MTJ element 1H in the reference cell RC due to the supplied current $I_{REF}$ can be prevented.

Accordingly, it is possible to prevent a defect in generation of the current $I_{REF}$ due to a variation in resistance value of the MTJ element in the reference cell RC.

As has been described above, according to the resistance change type memory of the first embodiment, the operation characteristics and reliability of the memory can be improved.

(2) Second Embodiment

Figure 6:
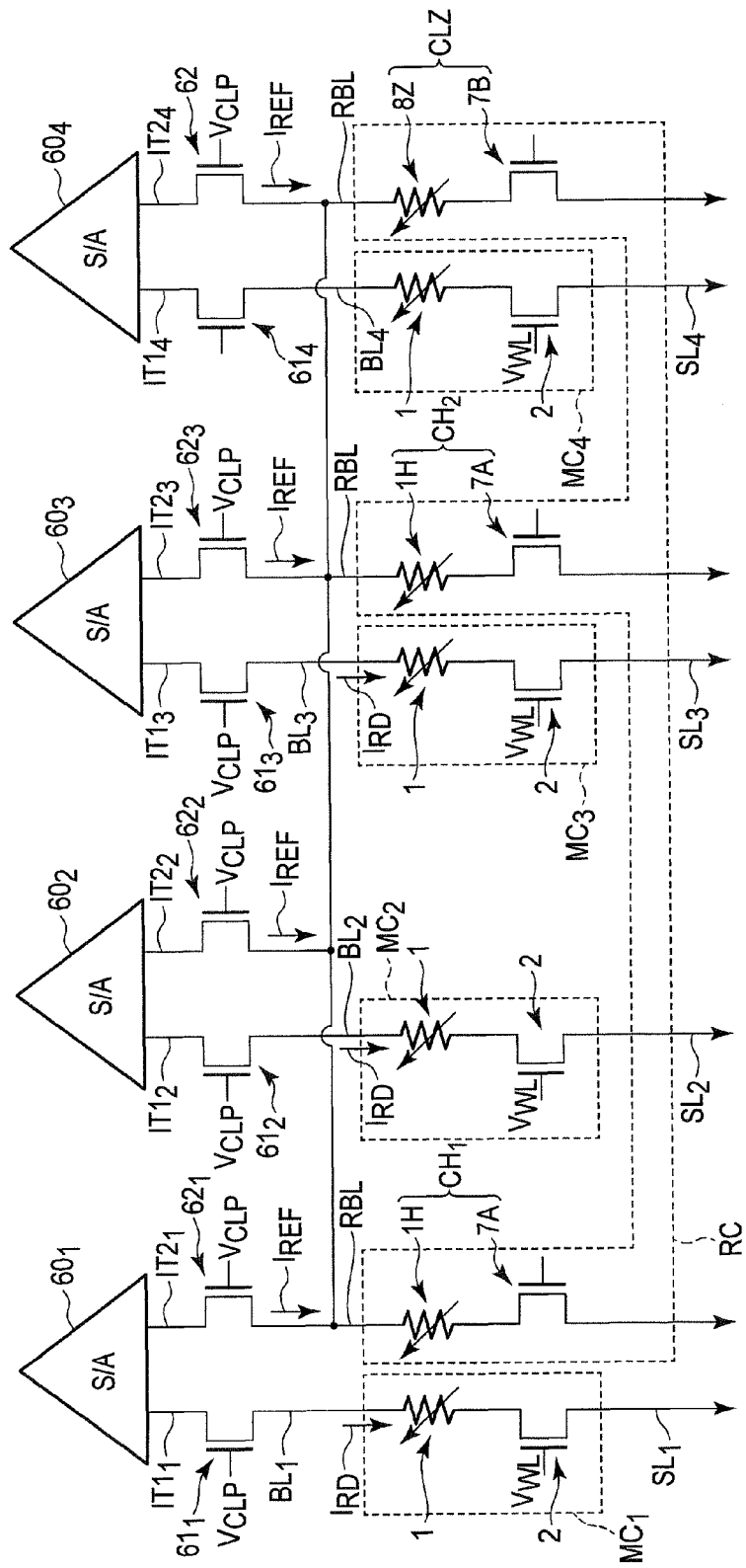
FIG. 6 is a view illustrating a structure example of a resistance change type memory according to a second embodiment.

Referring to FIG. 6, a resistance change type memory (e.g., MRAM) according to a second embodiment will be described. In the present embodiment, the same structural elements as in the first embodiment are denoted by like reference numerals, and a description thereof will be given where necessary.

FIG. 6 is a circuit diagram which schematically illustrates the resistance change type memory of the second embodiment and a circuit configuration of a read circuit in the resistance change type memory.

As illustrated in FIG. 6, one reference cell RC is shared by a plurality of sense amplifiers ("M"-number of sense amplifiers) $60_1$, $60_2$, $60_3$ and $60_4$ in the read circuit. The one reference cell RC is commonly connected to reference-side input terminals $IT2_1$, $IT2_2$, $IT2_3$ and $IT2_4$ of the plural sense amplifiers $60_1$, $60_2$, $60_3$ and $60_4$.

By the parallel process of an M-number of sense amplifiers $60_1$, $60_2$, $60_3$ and $60_4$, data is read out substantially simultaneously from an M-number of memory cells $MC_1$, $MC_2$, $MC_3$ and $MC_4$.

In high resistance cells ("1" cells) CH and a low resistance cell CLZ included in the reference cell RC of the MRAM of the present embodiment, a resistance element 8Z of one low resistance cell CLZ is shared by MTJ elements 1H of plural high resistance cells CH.

When one reference cell RC is shared by the M-number of sense amplifiers 60, the reference cell RC includes an N (=M/2) number of "1" cells CH. For example, as shown in FIG. 6, when four sense amplifiers $60_1$, $60_2$, $60_3$ and $60_4$ share one reference cell RC, two "1" cells CH1 and CH2, which include MTJ elements $1H_1$ and $1H_2$ in the high resistance state, respectively, are provided in on reference cell RC.

As in the first embodiment, the resistance value of the resistance element of the "0" cell, when the reference cell RC is formed of one "0" cell and one "1" cell, is set to be substantially equal to the resistance value R0 of the low resistance state ("0" data retention state) of the MTJ element (resistance change element) as the memory element.

On the other hand, as in the present embodiment, when one low resistance cell CLZ is shared by the N-number of high resistance cells ("1" cells) CH, a resistance value Rs0 of the resistance element 8Z of the low resistance cell CLZ has a magnitude expressed by R0/N, in order to increase the amount of current which is supplied to the low resistance cell CLZ, relative to the plural parallel-connected high resistance cells CH.

In this manner, when the low resistance cell CLZ is shared by the plural "1" cells CH, the magnitude of the resistance value Rs0 of the low resistance cell CLZ is set at not higher than the resistance value R0 of the MTJ element in the "0" data retention state, in accordance with the number (N) of "1" cells CH which share the low resistance cell CLZ.

Thereby, the intermediate resistance of the MTJ element 1 as the memory element is formed by the composite resistance between the resistance element 8Z of the low resistance cell CLZ included in the reference cell RC and the MTJ elements $1H_1$ and $1H_2$ in the high resistance state of plural high resistance cells $CH_1$ and $CH_2$, and the reference current $I_{REF}$ with a current value in a desired range is generated by the reference cell RC.

As in the example shown in FIG. 6, when the number (N) of "1" cells CH in the reference cell RC is two, the resistance value Rs0 of the resistance element 8Z in the low resistance cell CLZ is set at a magnitude that is half the resistance value R0 (i.e., R0/2) of the MTJ element 1 in the "0" data retention state.

The MTJ element $1H_1$, $1H_2$ in the high resistance state in the reference cell RC has substantially the same resistance value as the resistance value R1 of the high resistance state of the MTJ element 1 as the memory element.

By parallel processing, plural sense amplifiers 60 which share the reference cell RC can substantially simultaneously read out data from the memory cells $MC_1$, $MC_2$, $MC_3$ and $MC_4$ which are connected to input terminals $IT1_1$, $IT1_2$, $IT1_3$, and $IT1_4$ of the sense amplifiers 60.

The connection between the low resistance cell CLZ and the plural high resistance cells $CH_1$, $CH_2$, and the connection between the reference cell RC and sense amplifiers 60 are controlled by the control circuit (not shown) and the column control circuit 3.

FIG. 6 shows the example in which one low resistance cell CLZ is shared by two high resistance cells CH, but the present embodiment is not limited to this example. For example, when the reference cell RC is made common to eight or sixteen sense amplifiers 60, one low resistance cell CL with a resistance value R0/N is shared by four or eight high resistance cells.

In the meantime, in FIG. 6, when one reference cell RC is shared by plural sense amplifiers 60, a sense amplifier, such as sense amplifier $60_2$, having a reference-side input terminal IT2, to which the element is not directly connected, will occur. In order to secure a balance of the circuit operation and structure, a dummy cell including only a transistor may be connected to the reference-side input terminal IT2 of the sense amplifier. The dummy cell may be provided, for example, in the cell array or in the peripheral region (e.g., the column control circuit) of the cell array 9.

As in the MRAM of the present embodiment, when the low resistance cell CLZ is shared by the plural high resistance cells CH, the resistance value Rs0 of the fixed resistance element 8 can be decreased and, as a result, the size of the fixed resistance element 8 can be reduced. In addition, in the present embodiment, the resistance element 8 in the low resistance cell CLZ, which forms the reference cell RC, is made common to the plural high resistance cells CH, and thereby the number of low resistance cells ("0" cells) in the chip of the MRAM can be decreased.

As a result of the above, the area of the reference cell RC in the chip of the MRAM can be decreased, and the chip cost can be reduced.

As has been described above, according to the resistance change type memory of the second embodiment, the cost of the memory with the improved reliability can be reduced.

(3) Third Embodiment

Referring to FIG. 7, a resistance change type memory (e.g., MRAM) according to a third embodiment will be described. In this embodiment, the same structural elements as in the first and second embodiments are denoted by like reference numerals, and a description thereof will be given where necessary.

FIG. 7 is a circuit diagram which schematically illustrates the resistance change type memory of the third embodiment and a circuit configuration of a read circuit in the resistance change type memory.

As illustrated in FIG. 7, in the low resistance cell of the reference cell RC, the resistance element (fixed resistance element) may be omitted, and a transistor 7X in the low resistance cell CLX may be used as a load transistor.

The magnitude of a gate voltage $V_{LOAD}$ of the load transistor 7X in the low resistance cell CLX is controlled, and thereby the driving power (load, supply amount of current) of the transistor 7X is adjusted.

In this manner, the transistor 7X, whose driving power is controlled, functions as a resistance element, and thereby the reference cell RC including the transistor 7X and the MTJ element 1H in the high resistance state is formed.

In the present embodiment, with the driving power of the transistor 7X being controlled, the magnitude of the reference current $I_{REF}$, which is generated by the reference cell RC, is adjusted.

The matching of the resistance value (reference current) of the reference cell RC with MTJ element with respect to the variation in temperature and the variation in inter-terminal voltage is secured by the element with a high temperature/voltage dependency of the resistance value (the same resistance change element as the memory element; in this example, the MTJ element). Thus, in the present embodiment, the load transistor 7X can be used in place of the low resistance element ("0" resistance element) with a low temperature dependency/voltage dependency of the resistance value.

As in the present embodiment, the low resistance cell CLX included in the reference cell RC does not include the resistance element, and is formed of the transistor 7X which functions as a load. Thereby, the area of plural reference cells RC, which are provided in the cell array 9 or in the peripheral region 90 of the cell array 9, can be decreased.

As a result, according to the MRAM of the present embodiment, the chip cost of the MRAM can be reduced.

As has been described above, according to the resistance change type memory of the third embodiment, the cost of the memory with the improved reliability can be reduced.

(4) Fourth Embodiment

Referring to FIG. 8, a resistance change type memory (e.g., MRAM) according to a fourth embodiment will be described. In this embodiment, the same structural elements as in the first to third embodiments are denoted by like reference numerals, and a description thereof will be given where necessary.

FIG. 8 is a circuit diagram which schematically illustrates the resistance change type memory of the fourth embodiment and a circuit configuration of a read circuit in the resistance change type memory.

As illustrated in FIG. 8, in the MRAM of the present embodiment, the magnitude of a control voltage $V_{REF}$ of the input terminal IT2 on the reference cell side in each sense amplifier 60 is different from the magnitude of a control voltage (clamp voltage) $V_{cLP}$ of the input terminal IT1 on the memory cell side in the sense amplifier 60.

The control voltage $V_{REF}$ is applied to the gates of the transistors 62 which control the potentials of the input terminals IT2, to which the reference cell RC is connected, and the reference bit line RBL.

The magnitude of the control voltage $V_{REF}$ of the input terminals IT2 on the reference cell side in the sense amplifiers 60 is controlled, and thereby the magnitude of the reference current $I_{REF}$ which is generated can be controlled.

When the reference cell RC, which outputs the reference current $I_{REF}$ exceeding a tolerable range, is present in the chip of the MRAM, the magnitude of the reference current $I_{REF}$ of the MRAM can be adjusted by the control voltage $V_{REF}$. Thereby, the number of defective chips of MRAMs can be decreased, and the chip cost of the MRAM can be reduced.

In the meantime, the magnitude of the reference current $I_{REF}$ may be finely adjusted by controlling the magnitude of the gate voltage of the transistor 7B in the low resistance cell.

As has been described above, according to the resistance change type memory of the fourth embodiment, the cost of the memory with the improved reliability can be reduced.

(5) Modifications

In the above-described embodiments, the MRAM using MTJ element for the memory element (resistance change element) has been described as an example of the resistance change type memory.

However, the resistance change type memory of the present embodiments may be a resistive RAM (ReRAM), a phase change RAM (PCRAM), or an ion memory.

The memory element of the ReRAM is a resistance change element using a metal oxide or a perovskite oxide. The resistance state of the memory element of the ReRAM changes by varying the pulse width (application period of a pulse) or amplitude (current value/voltage value) of a write pulse, or the polarity (direction of application) of a write pulse.

In the PCRAM, a phase change element (resistance change element) using a chalcogenide or the like is used as a memory element. By the heat generated by a write current, a film in the phase change element as the memory element transitions into a crystalline state, or into an amorphous state, and thereby the resistance state of the memory element of the PCRAM changes.

In the ReRAM, PCRAM and ion memory, as described in the present embodiments, the reference cell RC for generating the reference current $I_{REF}$ (read level) of data read includes the resistance change element in the high resistance state and the resistance element (e.g., a polysilicon resistance element) with the resistance value which is substantially equal to (or lower than) the resistance value of the low resistance state of the resistance change element, in order to form the intermediate resistance of the memory element for generating the reference current. The data read of the ReRAM, PCRAM and ion memory is executed by substantially the same operation as the operation described in the present embodiments.

The memory cell array of the resistance change type memory of the present embodiments may be a cross-point type memory. As a select element of the memory cell of the cross-point type memory, a vertical type transistor may be used, or a non-ohmic element (e.g., diode) may be used. In the resistance change type memory using the cross-point type memory cell array, the read operation, which has been described in the present embodiments, can be executed by the reference cell included in the read circuit of the present embodiments.

In addition, the resistance change type memory of the present embodiments may be a multilevel memory in which one memory element stores data of two bits or more.

As has been described above, like the MRAMs described in the present embodiments, the characteristic/reliability of data read of the resistance change type memory using the ReRAM, PCRAM or ion memory is improved.

[Others]

The resistance change type memory of each of the above-described embodiments is used, for example, as a substitute memory for a dynamic RAM (DRAM) or static RAM (SRAM), etc.

For example, a cache memory (or a buffer memory) using the resistance change type memory of the present embodiment is implemented as a storage device such as a memory card or a solid state drive (SSD).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A resistance change type memory comprising:
   a memory cell including a first resistance change element as a memory element;
   a reference cell including a second resistance change element including the same materials as the first resistance change element, and a first element, the first element having a resistance value which is not higher than a resistance range of the first and second resistance change elements; and
   a read circuit including a first input terminal connected to the memory cell, and a second input terminal connected to the reference cell;
   wherein the first element is a transistor.

2. A resistance change type memory comprising:
   a memory cell including a first resistance change element as a memory element;
   a reference cell including a second resistance change element including the same materials as the first resistance change element, and a first element, the first element having a resistance value which is not higher than a resistance range of the first and second resistance change elements; and
   a read circuit including a first input terminal connected to the memory cell, and a second input terminal connected to the reference cell;
   wherein the resistance range of the first and second resistance change elements includes a first resistance value in a first resistance state of the first and second resistance change elements, and a second resistance value in a second resistance state of the first and second resistance change elements, the second resistance value being higher than the first resistance value, and
   wherein the first and second resistance change elements have at least one of a temperature dependency and a voltage dependency of the second resistance value in the second resistance state greater than at least one of a temperature dependency and a voltage dependency of the first resistance value in the first resistance state.

3. The resistance change type memory according to claim 1, wherein
a magnitude of a first control voltage on a first input terminal side of the read circuit is equal to a magnitude of a second control voltage on a second input terminal side of the read circuit.

4. The resistance change type memory according to claim 1, wherein
a magnitude of a first control voltage on a first input terminal side of the read circuit is different from a magnitude of a second control voltage on a second input terminal side of the read circuit.

5. A resistance change type memory comprising:
a plurality of memory cells, each of the memory cells including a first resistance change element as a memory element; and
a read circuit including a plurality of sense amplifiers and a reference cell shared by the plurality of sense amplifiers, each of the sense amplifiers including a first input terminal connected to one of the plurality of memory cells, and a second input terminal connected to the reference cell, the reference cell including an N-number of second resistance change elements including the same materials as the first resistance change element, and a first element, the first element having a resistance value which is not higher than a resistance range of the first and second resistance change elements.

6. The resistance change type memory according to claim 5, wherein
when data is read out from a memory cell,
first and second electric currents, which are less than a threshold at which resistance states of the first and second resistance change elements are changed, are supplied to a memory cell selected for reading out data and to the reference cell, respectively, the second electric current flowing in the second resistance change element in a direction identical to a direction in which the resistance state of the second resistance change element changes from a first resistance state of a first resistance value to a second resistance state of a second resistance value which is higher than the first resistance value.

7. The resistance change type memory according to claim 5, wherein the first element is a fixed resistance element.

8. The resistance change type memory according to claim 5, wherein the first element is formed of a polysilicon layer or a diffusion layer.

9. The resistance change type memory according to claim 5, wherein the first element is a transistor.

10. The resistance change type memory according to claim 5, wherein
the resistance range of the first and second resistance change elements includes a first resistance value in a first resistance state of the first and second resistance change elements, and a second resistance value in a second resistance state of the first and second resistance change elements, the second resistance value being higher than the first resistance value, and
the first and second resistance change elements have at least one of a temperature dependency and a voltage dependency of the second resistance value in the second resistance state greater than at least one of a temperature dependency and a voltage dependency of the resistance value in the first resistance state.

11. The resistance change type memory according to claim 5, wherein
a magnitude of a first control voltage, which is supplied to the first input terminal of each of the sense amplifiers, is equal to a magnitude of a second control voltage which is supplied to the second input terminal of the read circuit.

12. The resistance change type memory according to claim 5, wherein
a magnitude of a first control voltage, which is supplied to the first input terminal of each of the sense amplifiers, is different from a magnitude of a second control voltage which is supplied to the second input terminal of the read circuit.

13. The resistance change type memory according to claim 5, wherein
resistance states of the first and second resistance change elements include a first resistance state of a first resistance value and a second resistance state of a second resistance value which is higher than the first resistance value,
a composite resistance between the second resistance change element and the first element is a resistance value between the first resistance value and the second resistance value, and
the resistance value of the first element is expressed by R/N, wherein the first resistance value is expressed by R.

14. The resistance change type memory according to claim 2, wherein
a magnitude of a first control voltage on a first input terminal side of the read circuit is equal to a magnitude of a second control voltage on a second input terminal side of the read circuit.

15. The resistance change type memory according to claim 2, wherein
a magnitude of a first control voltage on a first input terminal side of the read circuit is different from a magnitude of a second control voltage on a second input terminal side of the read circuit.

\* \* \* \* \*